United States Patent [19]

Schladitz

[11] 4,042,163
[45] *Aug. 16, 1977

[54] METHOD FOR THE MANUFACTURE OF A HEAT EXCHANGER OR HEAT TRANSFER ELEMENT

[76] Inventor: Hermann Johannes Schladitz, 74 Plaentschweg, Munich, Germany

[*] Notice: The portion of the term of this patent subsequent to Oct. 22, 1991, has been disclaimed.

[21] Appl. No.: 606,221

[22] Filed: Aug. 20, 1975

[30] Foreign Application Priority Data

Aug. 23, 1974 Germany .............................. 2440563

[51] Int. Cl.² ...................... B21D 53/02; B23P 15/26
[52] U.S. Cl. .................................... 228/198; 427/237; 427/252
[58] Field of Search ............... 228/131, 184, 219, 198, 228/183; 29/157.3 R; 427/237, 239, 247, 287, 319

[56] References Cited

U.S. PATENT DOCUMENTS

| | | | |
|---|---|---|---|
| 2,390,160 | 12/1945 | Marvin | 427/247 |
| 2,690,980 | 10/1954 | Lander | 427/319 |
| 3,055,089 | 9/1962 | Drummond | 427/319 |
| 3,665,573 | 5/1972 | Werner et al. | 29/157.3 R |
| 3,702,780 | 11/1972 | Withers | 427/319 |
| 3,842,474 | 10/1974 | Schladitz | 29/157.3 R |

Primary Examiner—Ronald H. Smith
Assistant Examiner—S. Silverberg
Attorney, Agent, or Firm—Kane, Dalsimer, Kane, Sullivan and Kurucz

[57] ABSTRACT

The disclosure is of a novel method of manufacturing a heat exchanger or heat transfer element of the type which comprises a heat-conductive tube enclosing a heat-conductive, porous body attached to the inner surface of the tube so that heat conducted by the porous body is transferred by the outside tubular body. By the method of the invention, the porous body may be connected to the inner surface of the tubular body without significant reduction of the porosity of the porous body. The method comprises disposing the porous body in the tube, passing vapors of a thermally decomposable metallic compound through the porous body and tube, decomposing said compound in the zone where the porous body approaches the inner walls of the tube and depositing the metallic metal product of the decomposition at the points of approach between the porous body and the inner walls of the tube whereby the porous body is connected to the tubular body by the deposition.

9 Claims, 1 Drawing Figure

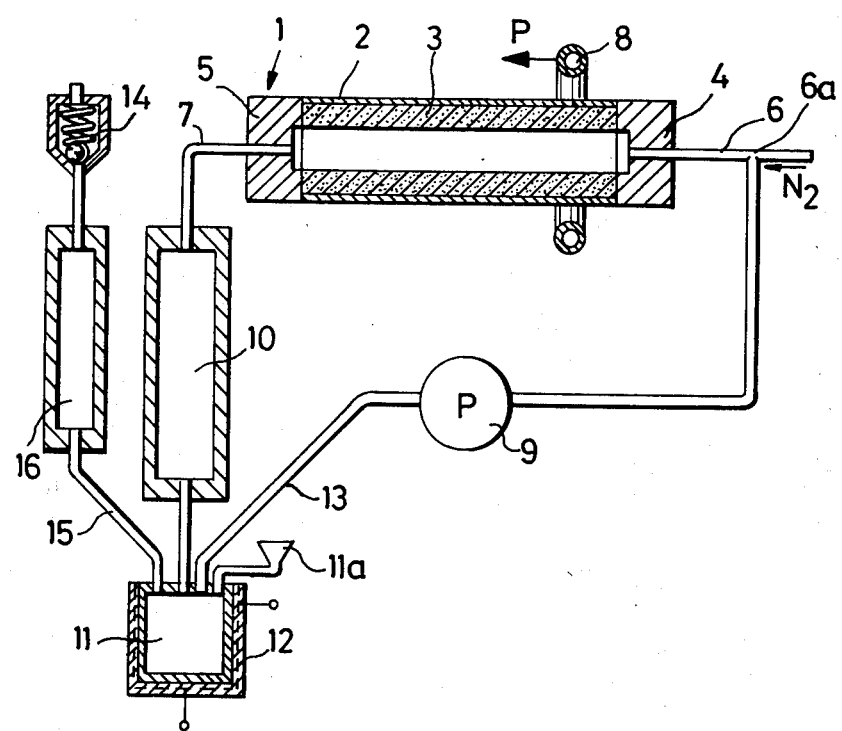

METHOD FOR THE MANUFACTURE OF A HEAT EXCHANGER OR HEAT TRANSFER ELEMENT

BACKGROUND OF THE INVENTION

1. Field of the Invention

This invention relates to a process for the manufacture of a heat exchanger or heat transfer element. It is concerned with the kind having a metal tube which contains a porous body metalically connected with the wall of the tube. The porous body is made of polycrystalline metal whiskers or metallised non-metal threads inserted loosely into the tube, or it may be in the form of a porous skeleton consisting of such whiskers or threads and insertable as a single member into the tube. The metallic connection is effected by depositing metal by means of the thermal decomposition of a metal compound.

2. Brief Description of the Prior Art

A heat transfer element representative of the prior art is described for example in published German Specification No. 2157807.

Heat exchanger or heat transfer elements of this kind are normally arranged to have a heat-absorbing and/or a heat-releasing liquid or gaseous medium flowing through a porous body disposed in a tubular member, while the tube wall acts as a constructional element which gives off or takes up heat. In every case it is of importance to obtain a speedy exchange or transfer, and this means that the porous body should have a very good heat conducting connection with the tube wall. This connection is produced by the deposition of metal by means of the thermal decomposition of a metal compound. The tube with the whiskers, threads or skeleton is heated to the decomposition temperature of the appropriate metal compound and this metal compound is passed through the tube. Metal deposition takes place not only in the area of contact of the whiskers, threads or skeleton with the tube wall, but also on the whiskers, the threads or in the pores of the skeleton remote from the tube wall. As a certain minimum deposition of metal is necessary for the achievement of a good heat conducting connection, the porosity of the body is reduced as a result of the metal deposition, which leads to increased flow resistances. This is undesirable in many cases.

It is an object of the invention to provide a method whereby a very good heat conducting connection is achieved between the outer portion of the porous body and the tube wall, and yet the throughflow resistance is not increased excessively.

SUMMARY OF THE INVENTION

According to the present invention there is provided a process for the manufacture of a heat exchanger or heat transfer element of the kind described above, wherein the tube wall is heated for a short period to the decomposition temperature of a thermally decomposable metal compound, said metal compound is supplied in vapour form and in cooled condition to one end of the tube and is passed through the porous body at a speed such that metal decomposition takes place principally adjacent the heated tube wall, and non-decomposed metal compound as well as gaseous separation products of the decomposed metal compound are discharged at the other end of the tube.

BRIEF DESCRIPTION OF THE DRAWINGS

The accompanying drawing is a diagram of a device for forming heating elements according to the method of the invention.

DETAILED DESCRIPTION OF THE INVENTION

The tube wall is heated only for a short time, and no significant heating of the porous body takes place apart from at its area of contact with the tube wall. In addition the porous body is constantly cooled by the passage of the metal compound. Thus only slight decomposition of the metal compound takes place within portions of the porous body remote from the tube wall and this results in a correspondingly small metal deposition. However, that is sufficient, when using loose whiskers or threads, to join them together. Therefore, with the above method it is possible to produce a thick metal deposition in the zone adjacent the tube wall and so a good heat-conducting connection between the porous body and the tube wall, without reducing the gaps or pores in the rest of the porous body to an undesirable extent through the metal deposition.

The heating of the tube wall is preferably achieved by an induction coil surrounding the tube and extending from one end of the porous body to the other. The induction coil may have current supplied intermittently, so that in the pauses between the heating periods the throughflowing metal compound can perform a cooling function without appreciable metal deposition taking place inside the porous body.

The metal compound is pumped through the tube until an adequate metal deposition has taken place on the tube wall and in the adjacent zone of the porous body. Preferably the discharge gases are recirculated, with the metal compound being made-up as necessary and cooled each time before re-entry into the tube.

For a better understanding of the invention, an embodiment thereof will now be described, by way of example, with reference to the accompanying drawing, in which the single FIGURE is a diagram of a device for forming heating elements of the kind referred to.

In this example nickel tetracarbonyl is used as the metal compound; its evaporation temperature is + 42° C, and its decomposition temperature is between 170° and 250° C. At the lower temperature the decomposition takes place more slowly but with a finer grain metal deposition than at the higher temperature.

A heat exchanger element 1 is to be formed from a metal tube 2 and a porous body 3 within the tube. The porous body 3 may consist of initially loose polycrystalline metal whiskers or metallised non-metal threads, for example quartz, glass, coal, graphite or ceramic (Al$_2$O$_3$), or of a performed porous skeleton made with such whiskers or threads.

The tube 2 is closed at both ends by means of caps 4 and 5. A duct 6 opens into the tube through the cap 4; it carries a gas mixture which contains a thermally decomposable metal compound in vapour form, as well as an inert carrier gas, for example nitrogen, which is fed into the circuit at 6a at the start of the process. A delivery pipe 7 issues from the other end cap 5 and will convey a gas mixture consisting of carrier gas, non-decomposed metal compound and gaseous separation products of the decomposed metal compound. An induction coil 8 surrounds the tube 2 and is moved in the direction of the arrow P from one end of the porous body 3 to the other. The induction coil 8 provides short-duration and locally limited heating of the internal tube wall and of the adjacent portion of the porous body 3, to a temperature at which the desired metal separation takes place.

The gas mixture is circulated by a pump 9 and enters the porous body 3 through duct 6. Carrier gas, non-decomposed gaseous nickel tetracarbonyl and gaseous separation products of the carbonyl decomposed in the tube 2 emerge at the other end and are directed through the outlet duct 7 to a cooler 10 where the gaseous mixture is cooled down to near the evaporation temperature of the nickel tetracarbonyl, that is to near 42° C. From the cooler 10 the cooled gas mixture is led to a closed container 11 surrounded by an electric heater 12. Liquid nickel tetracarbonyl is introduced into the container 11 through a filling funnel 11a and is evaporated by being heated to a temperature within the range of from 20° to 42° C., the additive amount being such that the gas mixture, after leaving the container 11, again exhibits the desired content of gaseous metal compound. The container 11 is connected by means of a duct 13 with the pump 9 and thence to the duct 6.

As a result of the decomposition of the nickel tetracarbonyl the pressure in the circuit increases, as four molecules of CO are released per molecule of nickel tetracarbonyl. In order to keep the pressure constant, an excess-pressure valve 14 is connected with the circuit via a duct 15. In order to prevent escape of nickel tetracarbonyl in vapour form through the valve 14 as much as possible, a cooler 16 is provided in the duct 15 to reduce the temperature of the throughflowing gas mixture to at least the condensation temperature of the nickel tetracarbonyl, and in practice to about −20° C. The liquid carbonyl trapped by the cooler 16 flows back into the container 11.

As the extent of the decomposition of a thermally decomposable metal compound is dependent upon time and temperature, a complete decomposition in a short time is achieved only at relatively high temperatures. In the arrangement described, therefore, deposition of metal takes place principally over the tube inner wall and on the adjoining portions of the whiskers, the metallised threads or the performed skeleton. In the remaining part of the porous body only a slight decomposition takes place, as this is cooled by the throughflowing cool metal compound. Metal deposition in this remaining part may be controlled by the admission temperature of the metal compound as well as by means of the flow rate in such a manner that a precise metal coating, just sufficient for the binding of the individual whiskers or threads, takes place. Adjacent the tube inner wall, on the other hand, a thick metal deposition is obtained, which provides the desired good heat-conducting connection between the porous body 3 and the tube wall.

Preferably, current is supplied to the induction coil 8 intermittently, in such a manner that in the pauses between heating periods the throughflowing gas mixture carries heat away without an appreciable metal deposition taking place in the porous body 3.

Another particularly suitable thermally decomposable metal compound, alternative to nickel tetracarbonyl, is iron pentacarbonyl which has an evaporation temperature of 120° C and a decomposition temperature between 170° and 250° C. Accordingly, when using iron pentacarbonyl the gas mixture in the cooler 10 is cooled down to near 105° C and in the cooler 16 down to about −20° C. The temperature in the container 11, with iron pentacarbonyl, is held at 50° to 105° C.

The process may be carried out with other thermally decomposable metal compounds, for example cobalt carbonyl, chromium carbonyl, tungsten carbonyl, molybdenum carbonyl as well as metal acetyl acetonates, e.g. nickel acetyl acetonate, or dicumene chromium.

The finished heat exchanger element may be used, for example, for the fast heating of gases, liquids, vapours and aerosols, which are pumped through the porous body 3 while the tube 2 is heated, such as by an electric heating coil. Such uses for heat exchangers are described, for example, in German Patent Specification No. 1,288,705.

In the same manner as described above for a heat exchanger element, it is also possible to manufacture a heat transfer element, in particular a so-called heat pipe. A good heat-conducting connection between the pipe and the capillary system is again achieved, particularly in the area of the heat-absorbing and heat-releasing end of the heat pipe.

What I claim is:

1. A method of manufacturing a heat exchanger or heat transfer element which comprises a heat-conductive tubular member having an inner surface enclosing a heat-conductive, porous body attached by thermally-conductive means to the inner surface of the tubular member, which comprises;
   a. providing said porous body disposed within said tubular member;
   b. passing vapors of a thermally decomposable metallic compound through the porous body and the tubular member; and
   c. thermally decomposing said compound in a first zone of said porous body adjacent to the inner surface of the tubular member, by heating said tubular member while maintaining said compound from substantial thermal decomposition in a second zone of said porous body remote to the inner surface of the tubular member; whereby the metallic product of said decomposition is deposited at said first zone and connects the porous body to the inner surface of the tubular member.

2. A method according to claim 1 wherein the vapors of thermally decomposable metallic compound are entrained in an inert carrier gas.

3. A method according to claim 1 wherein said decomposing is carried out by heating the tubular member with an induction coil.

4. A method according to claim 3 wherein current is supplied intermittently to the induction coil.

5. A method according to claim 1 wherein said maintaining is carried out by heating said tubular member for a period of time insufficient to cause significant heating of the porous body in said second zone and by the speed of said passing of the vapors.

6. A method according to claim 1 wherein said compound is nickel tetracarbonyl, said decomposing is carried out by heating the nickel tetracarbonyl vapors above the temperature at which said compound decomposes and said maintaining is carried out by keeping the temperature of said vapors passing through said second zone between the temperature at which said compound vaporizes and the temperature at which said compound decomposes to obtain the metallic product.

7. A method according to claim 1 wherein said compound is iron pentacarbonyl, said decomposing is carried out by heating the iron pentacarbonyl vapors above the temperatureat which said compound decomposes and said maintaining is carried out by keeping the temperature of said vapors passing through said second zone between the temperature at which said compound vaporizes and the temperature at which said compound decomposes to obtain the metallic product.

8. A method according to claim 1 wherein the vapors of undecomposed compound after passing through the porous body and the tubular member are recirculated, with make-up compound vapors being added as necessary, to be passed again in step (b).

9. A method according to claim 8 wherein said vapors after passing through the porous body and the tubular member are cooled to approach the evaporation temperature of said compound, the make-up compound is added in liquid form, the mixture of cooled compound and make-up compound is heated to evaporate the mixture and the resulting vapors are passed again in step (b).

* * * * *